United States Patent
Seigler et al.

(10) Patent No.: US 7,448,008 B2
(45) Date of Patent: Nov. 4, 2008

(54) METHOD, SYSTEM, AND PROGRAM PRODUCT FOR AUTOMATED VERIFICATION OF GATING LOGIC USING FORMAL VERIFICATION

(75) Inventors: Adrian E. Seigler, Poughkeepsie, NY (US); Gary A. Van Huben, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 11/468,078

(22) Filed: Aug. 29, 2006

(65) Prior Publication Data

US 2008/0059925 A1    Mar. 6, 2008

(51) Int. Cl.
G06F 17/50    (2006.01)
G06F 19/00    (2006.01)

(52) U.S. Cl. ............................................. 716/6; 703/16

(58) Field of Classification Search .................... 716/6; 703/16
See application file for complete search history.

(56) References Cited

U.S. PATENT DOCUMENTS

| | | | |
|---|---|---|---|
| 4,264,782 A | 4/1981 | Konheim et al. ............... 178/22 |
| 5,831,991 A | 11/1998 | Miller et al. ................ 371/22.1 |
| 6,279,146 B1 | 8/2001 | Evans et al. .................... 716/18 |
| 6,505,317 B1 | 1/2003 | Smith et al. .................. 714/738 |
| 6,553,524 B1 | 4/2003 | Das ............................ 714/726 |
| 6,615,392 B1 * | 9/2003 | Nadeau-Dostie et al. ........ 716/5 |
| 6,651,225 B1 * | 11/2003 | Lin et al. ......................... 716/4 |
| 6,883,152 B2 * | 4/2005 | Bednar et al. ................... 716/5 |
| 6,938,228 B1 * | 8/2005 | Zhong ............................ 716/4 |
| 7,028,278 B2 * | 4/2006 | Jain ............................... 716/5 |
| 7,334,203 B2 * | 2/2008 | Chan .............................. 716/6 |
| 2002/0152060 A1 * | 10/2002 | Tseng .......................... 703/17 |
| 2003/0079189 A1 * | 4/2003 | Abadir et al. ................... 716/4 |
| 2004/0015799 A1 * | 1/2004 | Jain ............................... 716/5 |
| 2004/0153978 A1 * | 8/2004 | Xiang et al. ................... 716/3 |
| 2006/0075367 A1 * | 4/2006 | Chan .............................. 716/6 |
| 2006/0117274 A1 * | 6/2006 | Tseng et al. ................... 716/1 |
| 2007/0005323 A1 * | 1/2007 | Patzer et al. .................. 703/14 |
| 2007/0174805 A1 * | 7/2007 | Hsu et al. ..................... 716/18 |
| 2007/0271536 A1 * | 11/2007 | Seawright et al. ............... 716/5 |
| 2008/0098339 A1 * | 4/2008 | Chan .............................. 716/6 |

FOREIGN PATENT DOCUMENTS

JP    2002141414 A    5/2002

OTHER PUBLICATIONS

Aagaard et al., "Formal Verification Using Parametric Representations of Boolean Constraints", Proceedings of 36th Design Automation Conference, Jun. 21-25, 1999, pp. 403-407.*

(Continued)

*Primary Examiner*—Phallaka Kik
(74) *Attorney, Agent, or Firm*—Lynn L. Augspurger; Graham S. Jones, II (57) ABSTRACT

Automated verification methodology parsing scripts auto generate testbench hardware design language, such as VHDL or Verilog, from the design source VHDL or Verilog. A formal verification model is then built comprising the testbench VHDL and the design under test. The resulting design verification tool then provides proofs and counterexamples for all of the rules, e.g., auto-generated rules, in the testbench.

17 Claims, 7 Drawing Sheets

OTHER PUBLICATIONS

Bassemir, "Method to Debug and Temp Fix Around LSSD VLSI Design Errors", IBM Technical Disclosure Bulletin, Dec. 1987, pp. 19-22.

Bardell et al. "Random Pattern Testability of the Logic Surrounding Memory Arrays" Jul. 1987 IBM Technical Disclosure Bulletin pp. 521-528.

* cited by examiner

```
LIBRARY ieee;                              ⎫
USE ieee.std_logic_1154.all;               ⎬ 60
USE ieee.numeric.std,all;                  ⎪
USE work.std_ulogic_support.all            ⎭

ENTITY macro IS PORT (                     ⎫
   Fails : OUT std_ulogic_vector (0 to 2); ⎪
   intf_sig : IN std_ulogic;               ⎬ 61
   gate : IN std_ulogic;                   ⎪
   Osig : IN std_ulogic;                   ⎭

--!! FAIL OUTPUTS;                         ⎫
--!!    0:    "reg1_q";                    ⎪
--!!    1:    "reg1_q";                    ⎬ 62
--!!    2:    "reg1_q";                    ⎭
END macro;

ARCHITECTURE macro of macro IS
BEGIN gate  <= '1';   -- Drive fence active   } 63 osig  <= '0';   -- Zero out unfenced sigs } 64 fails(0: <= NOT (reg1_s = reg1_q);      ⎫
   fails(1: <= NOT (reg2_s = reg2_q);      ⎬ 65
   fails(2: <= NOT (reg3_s = reg3_q);      ⎭
END macro;
```

METHOD, SYSTEM, AND PROGRAM PRODUCT FOR AUTOMATED VERIFICATION OF GATING LOGIC USING FORMAL VERIFICATION

BACKGROUND

1. Field of the Invention

The invention relates to methods, systems, and program products for evaluating the behavior of designed circuit components, by, for example, transforming a high-level, multi-domain design into its hardware implementation.

2. Background Art

Gating logic is an essential part of systems with multiple chips or multiple clock domains. The purpose of gating logic is to prevent spurious logic activity from "contaminating" a domain under test while the system is in the process of being reset or reconfigured. That is, when an incoming fence signal is active on a particular chip or domain, the internal logic on the chip or domain must be impervious to random transitions that may be present on any number of incoming interface busses or signals.

Thus, a complete verification of gating logic requires demonstration that all logic associated with a particular fence or set of fences is effectively quiesced during any window of time that the fences are active. Since a single fence line typically serves to protect a multitude of interface signals from causing downstream logic activity to occur, simulation alone is typically not sufficient to provide coverage on every possible interface transition scenario. This is non-trivial since any design bugs in gating logic that are not found prior to design release can pose the disastrous possibility of rendering the hardware useless. Therefore, a more robust method of verifying gating logic is needed to provide enhanced problem discovery capability and coverage.

SUMMARY OF THE INVENTION

The method, system, and program product described herein provides a robust method of verifying gating logic, most commonly used as fencing logic, and segregating clock domains. This provides enhanced problem discovery capability and coverage.

The method, system, and program product described herein applies formal verification tools to prove or disprove rules pertaining to undesired logic transitions when fence signals are active. The rules required to verify correct behavior of gating logic are generated from design source files, that is, VHDL files or Verilog files. This results in the creation of robust verification methods that can be applied to any chips or systems containing gating logic. The method, system and program product described herein yields proofs and counterexamples regarding the gating logic under test. This provides enhanced problem discovery potential and coverage.

As described herein the automated verification methodology parsing scripts auto generate testbench VHDL from the design source VHDL. A formal verification model is then built, with the model comprising the testbench VHDL and the design under test. The resulting design verification tool then provides proofs and counterexamples for all of the rules, e.g., auto-generated rules, in the testbench.

DETAILED DESCRIPTION

As described herein the automated verification methodology parsing scripts auto generate testbench, e.g., VHDL or Verilog or the like, from the design source, such as VHDL or Verilog or the like. A formal verification model is then built with the model comprising the testbench VHDL or Verilog and the design under test. The resulting design verification tool then provides proofs and counterexamples for all of the rules, e.g., auto-generated rules, in the testbench.

Figure 1:
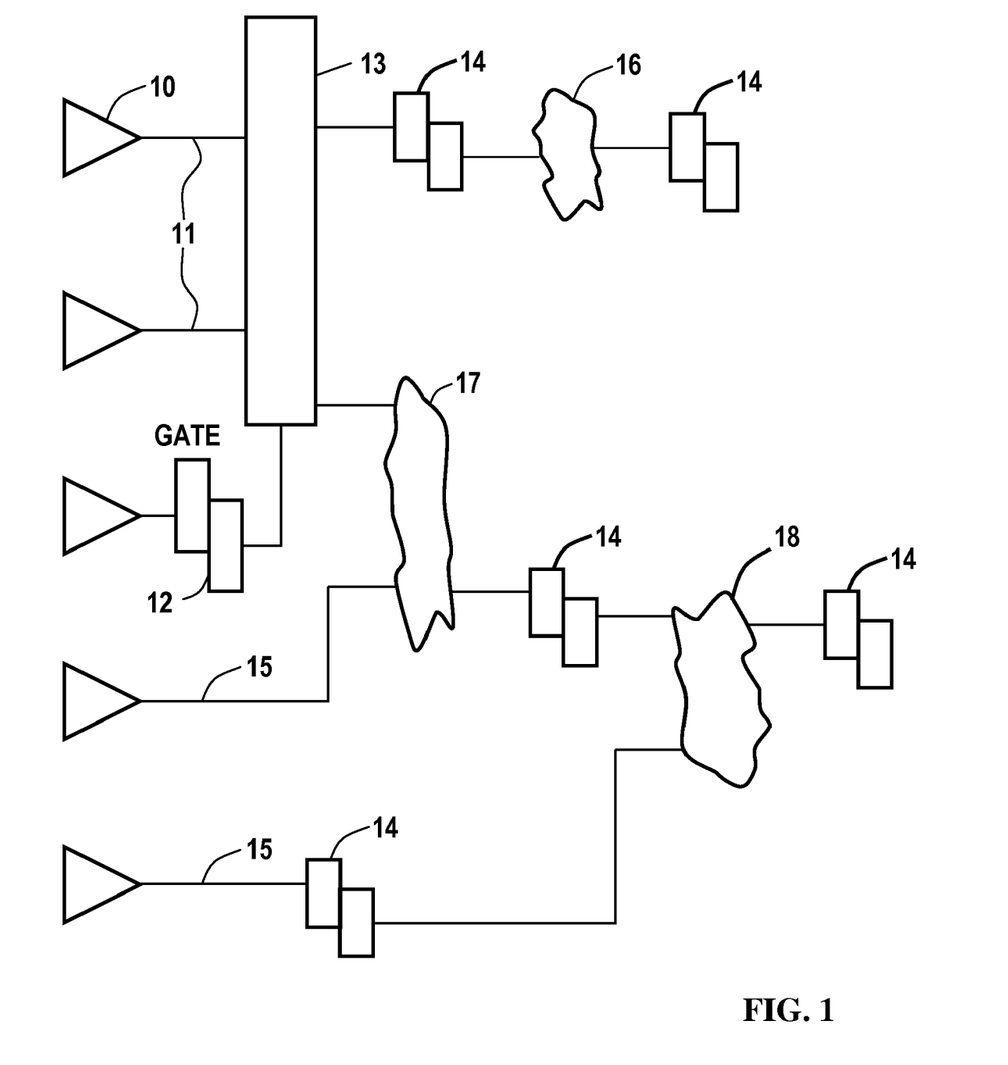
FIG. 1 shows a typical design topology for which the present invention can be used to verify the gating structures.

FIG. 1, depicts a typical arrangement of latch devices (14) and combinatorial logic. Although the preferred embodiment illustrates master-slave latches, one skilled in the art will appreciate that the present invention will work with any type of latch that can be modeled in a verification environment. Receiver circuits (10) may represent chip I/O, or internal macro I/O. In FIG. 1 various interface signals are shown being received into the design under test. Interface signals (11) depict a typical gating implementation wherein said interface signals pass immediately through a gating structure (13) prior to being latched (combinatorial logic is depicted. Although the preferred embodiment illustrates master- 14) or propagating into internal combinatorial logic (17).

In FIG. 1 the gating structure (13) is controlled by a gate (12) which may also be received into the design under test as an additional interface signal, or it may emanate from a latch element, or it may be a combination of both an incoming signal that is being latched prior to use, as shown. It will be appreciated by one skilled in the art that the present invention provides proper verification for any type of gating signal topology. The two interface signals (15) represent receiving circuits that are protected by the gate (12) condition. These signals may be intentionally void of gating because the design does not require it, or they are meant to be fenced, but the gating is absent in error In the former case, our invention permits the coexistence between signals, which require verification, and those that do not. It is the latter case, for which our invention contemplates a formal method of discovery.

FIG. 1 further shows that the present invention handles a plurality of ungated interface signals (15) wherein either the signal is received directly into a latch (14) or propagates through combinatorial logic (17) prior to being latched. Additionally, one will note that combinatorial logic (17) may accept a plurality of gated interface signals (11) or ungated signals (15) prior to terminating in downstream latches (14). Combinatorial logic (18) represents structures bounded by latches (14), which are either intentionally void of gating, or erroneously missing a required gating structure. Finally, FIG. 1 also shows the remaining case wherein a combinatorial logic structure (16) is completely contained within an area subject to gating, and as such, is bounded by latches requiring said verification of the gating structure (13).

While our invention is described in the context of a gating application, it will be appreciated by one skilled in the art that the method, system, and program product of the invention is applicable to other types of gating applications such as, but not limited to, clock gating and power gating.

Figure 2:
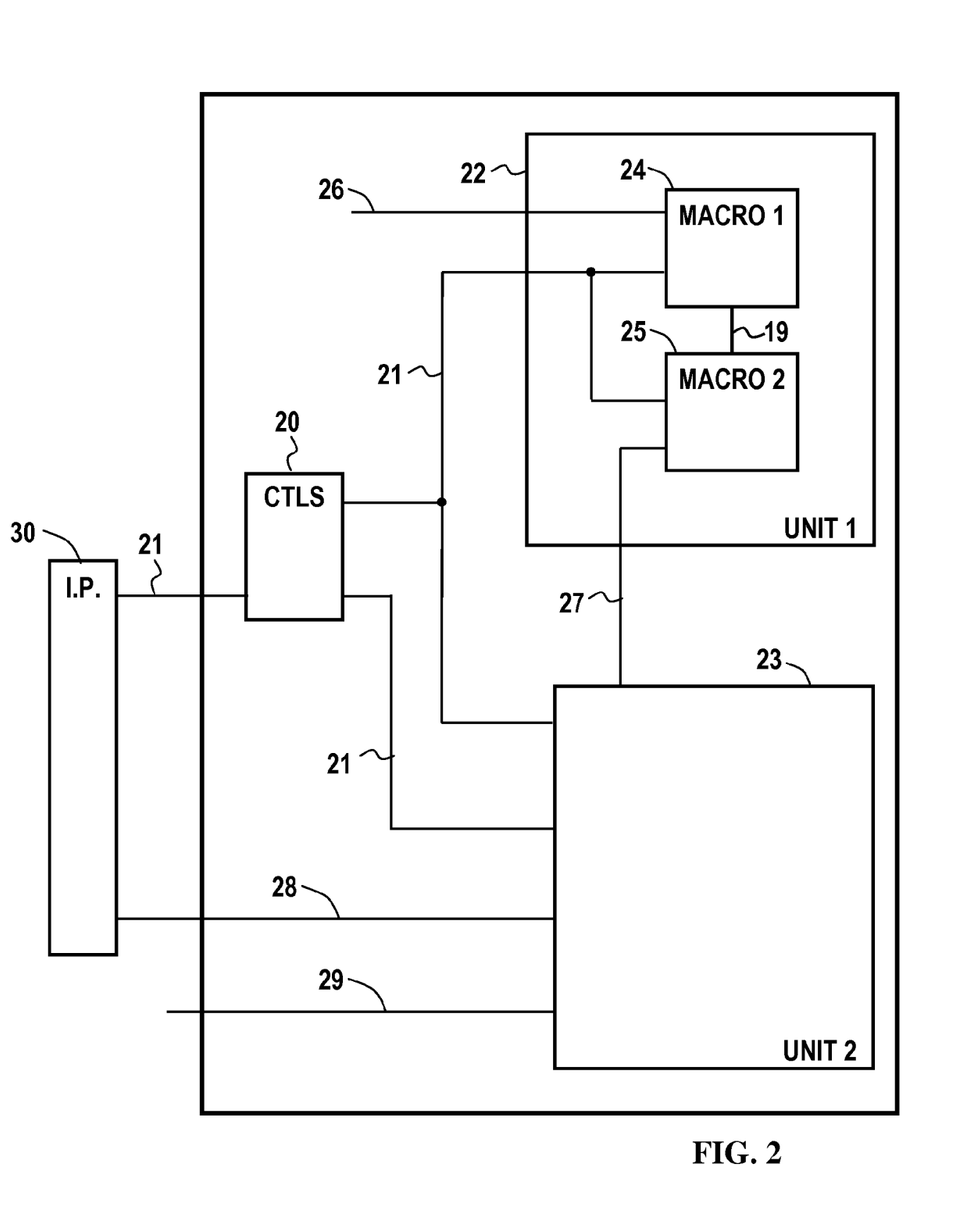
FIG. 2 illustrates the ability of the present invention to work with any exemplary hierarchical design structure.

FIG. 2 illustrates the scalability of the method, system, and program product of the present invention. FIG. 2 shows what might be a typical ASIC or custom logic design comprising a multitude of hierarchical elements such as the chip, functional units and leaf level macros. These various logic structures are gated with representative gating signals (21) which are distributed to units, including entities, design structures, components, macros, and elements within the chip as well as an external piece of Intellectual Property (I. P. 30) such as a DRAMs, bridge chips, PCI-X controllers, DMA controllers, or any other I. P. structure that requires some type of external gating. These gating signals are driven from a central controller (20), but one skilled in the art will contemplate how these gating signals could emanate from any of the possible sources (latch, receiver, controller, etc) depicted in FIGS. 1 and 2.

Our invention includes a method for verifying any type of hierarchical design structure including the one shown wherein a multitude of macros such as Macro1 (24) and Macro2 (25) receive external interface signals (26) protected by a representative gating signal (21) and emanating from either within the chip or outside of the chip, as well as interface signals (27) from another unit (23) which may also be protected by a said representative gating signal (21). Alternatively, one or both of said interface signals (26 and 27) might not be subjected to gating. Also, one will notice that our invention contemplates interfaces (19) between macros (24, 25), which may or may not be subject to said representative gating signals (21).

FIG. 2 further illustrates a plurality of units including Unit1 (22) and Unit2 (23) wherein each thereof may accept internal or external interface signals, and the signals may or may not be subjected to gating. Furthermore, FIG. 2 shows a functional unit, Unit2 (23) comprising two types of interface signals. A first interface signal (29) is a typical interface which may or may not be subject to gating and a second interface signal (28) connecting Unit2 (23) to I. P. (30) indicating the ability of our invention to verify gating on interfaces between ASIC or custom elements and industry standard I. P.

Figure 3:
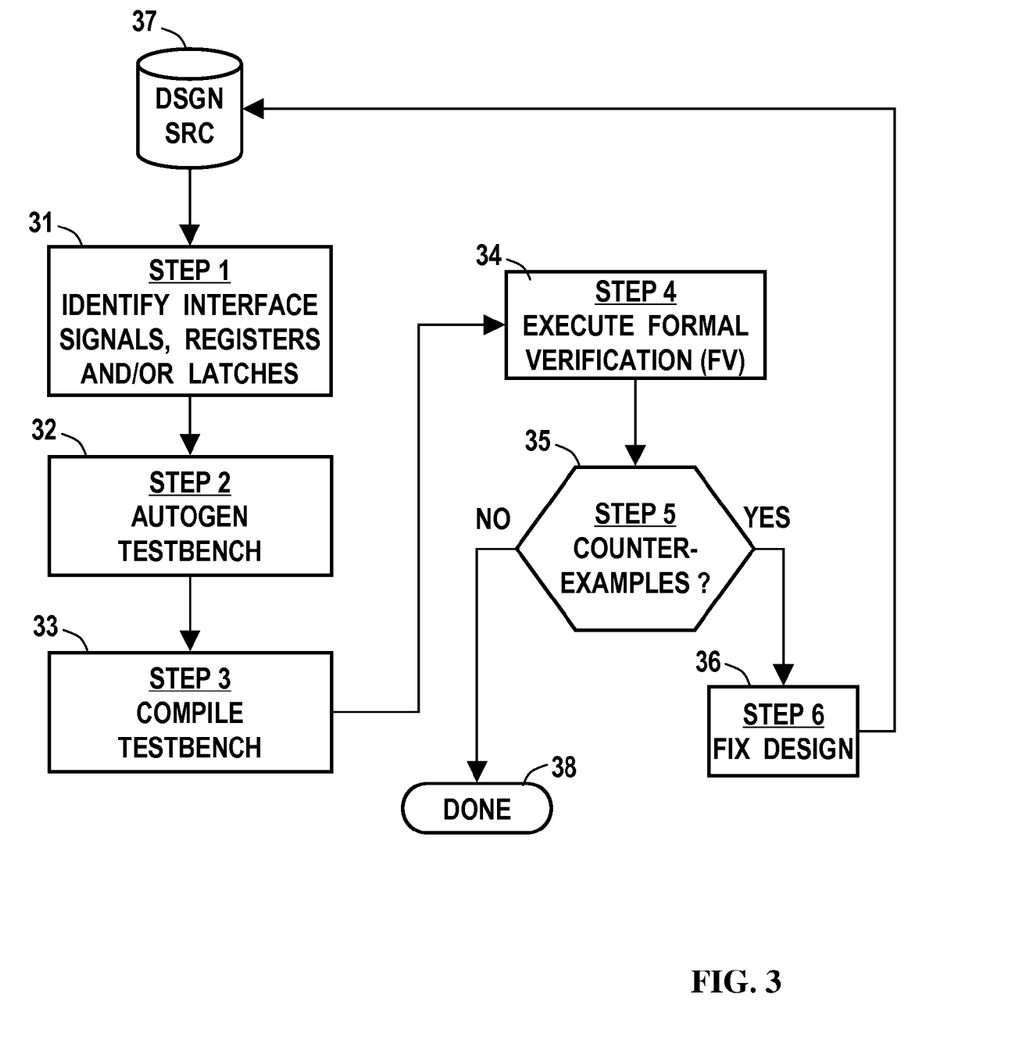
FIG. 3 shows the method steps of the present invention.

The present invention is best understood through the method steps of a process identified in FIG. 3. The processing steps begin with an Identify I/F & Registers Step 1 (31), which identifies the interface signals that require gating verification. Additionally, this Step 1 (31) denotes the registers and/or latches that are asserted to remain stable. The primary input for Step 1 (31) is received from a Design Source (37), and it may also be supplemented by some type of design documentation.

Our preferred embodiment of the present invention automates Step 1 (31) through the use of design source VHDL, coupled with the application of the invention on a macro basis, that is an entity, design structure, component, or element basis. This allows for each macro to be independently verified using the overall assertion that all registers and latches within said macro will remain stable during gating. The method, system, and program product of the present invention is scalable and extensible to any design hierarchy. Identification of the gated interface signals is provided by a combination of a documented list in concert with a strongly nomenclated signal naming convention. An automated program extracts the list of registers and latches from each macro (that is, each entity, design structure, component, or element) by exploiting the register keyword in the signal declaration portion of the VHDL. This facilitates scalability and extensibility.

Although the preferred embodiment capitalizes on a particular design under test to easily automate this step, one skilled in the art will appreciate how this step can be applied to any design structure by utilizing design documentation, data sheets or other forms of communication to convey the list of interface signals which require gating protection and those latches which are asserted to remain stable. Once again, this may or may not be all the registers embodied within the design under test. In any case, the present invention need only identify the appropriate interface signals and registers for Step 1 (31). Additionally, one skilled in the art will also appreciate how the present invention is not tied to design described using the VHDL language, and in fact can incorporate designs utilizing a multitude of description languages such as, but not limited to, Verilog, ADA, and C++.

Autogen Testbench Step 2 (32) of the present invention contemplates the automated generation of a testbench, which will be used to drive the formal verification step. In a typical formal verification exercise, creation and maintenance of the testbench is normally very resource intensive. Our invention improves on this by using the list of interfaces and registers from Step 1 (31) as an input to a program, which produces a boilerplate testbench complete with automated rules to verify the assertions regarding latch stability Compile Testbench Step 3 (33) is a typical step embodied in most any verification methodology wherein the testbench needs to be compiled into some type of verification model. In the case of the preferred embodiment, this step is contained with IBM's Sixth Sense user interface, which will accept any supplied testbench and compile it along with the input from the design source under test (37).

The next step, Execute Formal Verification (FV), Step 4 (34), actually executes the formal verification process to deterministically prove that all latches and registers asserted to remain stable under a gating condition will indeed be stable. This involves complex mathematical evaluations of every potential state space in an attempt to produce a counter example illustrating how a particular latch can change state while its associated fence signal is being applied. Counter-Examples ? test Step 5 (35) is where the user awaits the outcome of the Formal Verification step (34) and tests to see whether formal verification was able to produce any said counter examples. If not, (NO) then the verification is complete and all identified interfaces are concluded to be properly gated and the method branches to DONE (38). On the other hand, if counter examples exist (YES), they must be reviewed by the design team to determine whether it is a false fail the method branches to Fix Design Step 6 (36). False fails can occur in cases where interfaces and/or registers are improperly tagged in Step 1 (31). Assuming the fail is legitimate, and then the design source (37) is updated to fix the error by an output from Fix Design Step 6 (36). The process is then repeated until the design source completes the Formal Verification step (34) without any counter examples.

Figure 4:
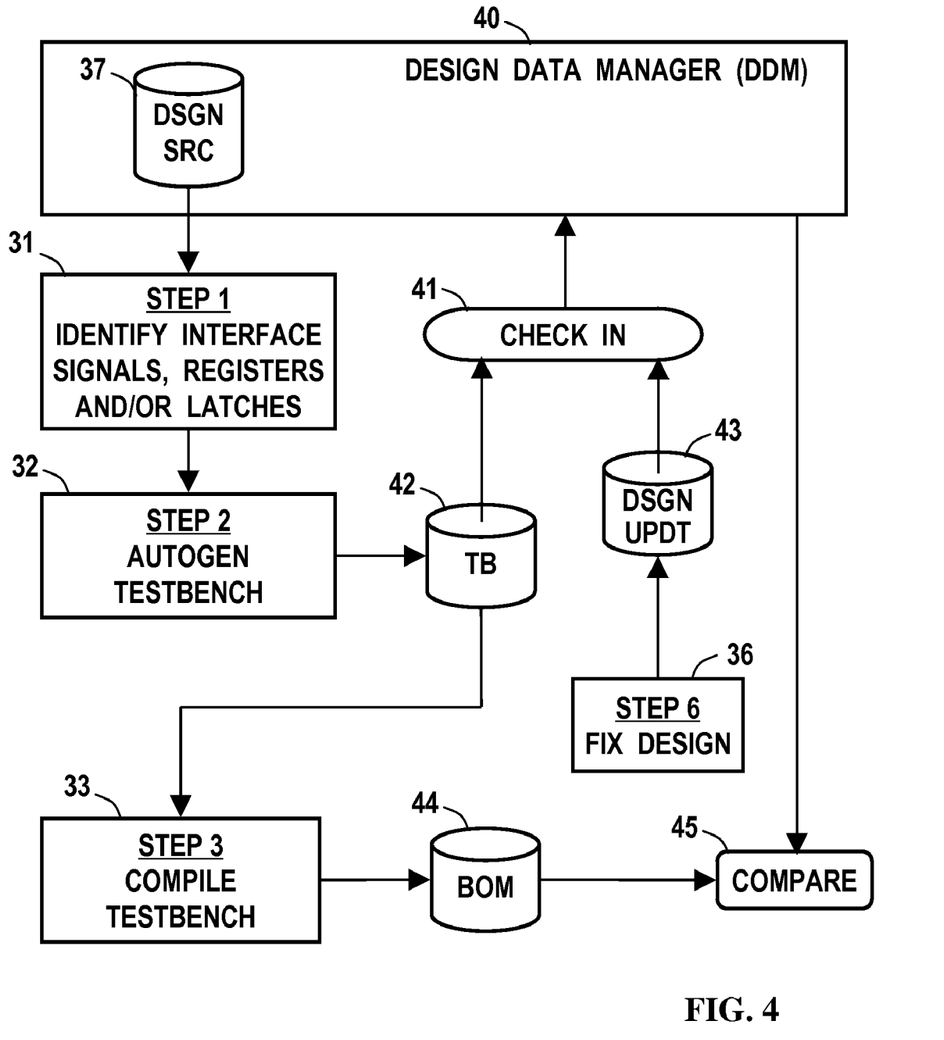
FIG. 4 illustrates the present invention interacting with a common data management system.

Since complex designs often require several iterations through the method steps of FIG. 3, our invention contemplates an additional data management facility depicted in FIG. 4 to augment said method steps. As shown in FIG. 4, the present invention provides a means for the testbench TB (42) produced by the automated Autogen Testbench Step 2 (32) to be deposited into a data management repository. The data management repository, comprising a Design Data Manager (40) such as the one disclosed in commonly assigned U.S. Pat. No. 5,966,707, of Van Huben et al. "Method for Managing a Plurality of Data Processes Residing In Heterogeneous Data Repositories" provides for a Check In (41) method suitable for applying version and ownership control to design source files.

Although the preferred embodiment entails the use of an IBM Design Data Manager (DDM), one skilled in the art can appreciate how any industry standard data management facility with version control capability may be substituted in its place. It is commonly accepted that data managers with version control capability provide facilities for checking design data into the repository and facilities for checking it out for editing under locking supervision.

FIG. 4 is further enhanced to show that the same testbench (42) file checked into the Design Data Manager (DDM) is also used as the input to Step 3, which is the Compile Testbench step (33). The same provision for checking in source files is also employed for Design Updates (43) as a result of Fix Design Step 6 (36). In the preferred embodiment, these design updates are checked in with a new version number to differentiate them from the original Design Source (37) in the DDM (40) in which the design problem was discovered.

Upon completion of the Compile Testbench Step 3 (33), the present invention contemplates the creation of a testbench Bill of Materials (BOM) listing (44) comprising all design data inputs used in the compilation of the verification model. This list employs the version control information from the DDM (40) to provide a unique identifier for every iteration of design source (37). In addition to the VHDL file, this may also be applied to the testbench files (42) and any documentation used for Step 1 (31). The IBM DDM facility referenced by the preferred embodiment permits fill data management capability across all types of data, including but not limited to, VHDL, text files, html, pdfs, Microsoft Word documents, etc. Once the testbench BOM (44) is created, it is then used in the Compare (45) step, which constantly monitors the DDM (40) for updates to any of the design pieces. By generating a temporary list of the current design iterations (using version numbers as a reference point), the Compare step (45) compares that list to the testbench BOM (44). This ensures that the latest iteration of all necessary design components have undergone the formal verification method of the present invention prior to releasing the design for fabrication.

Figure 5A:
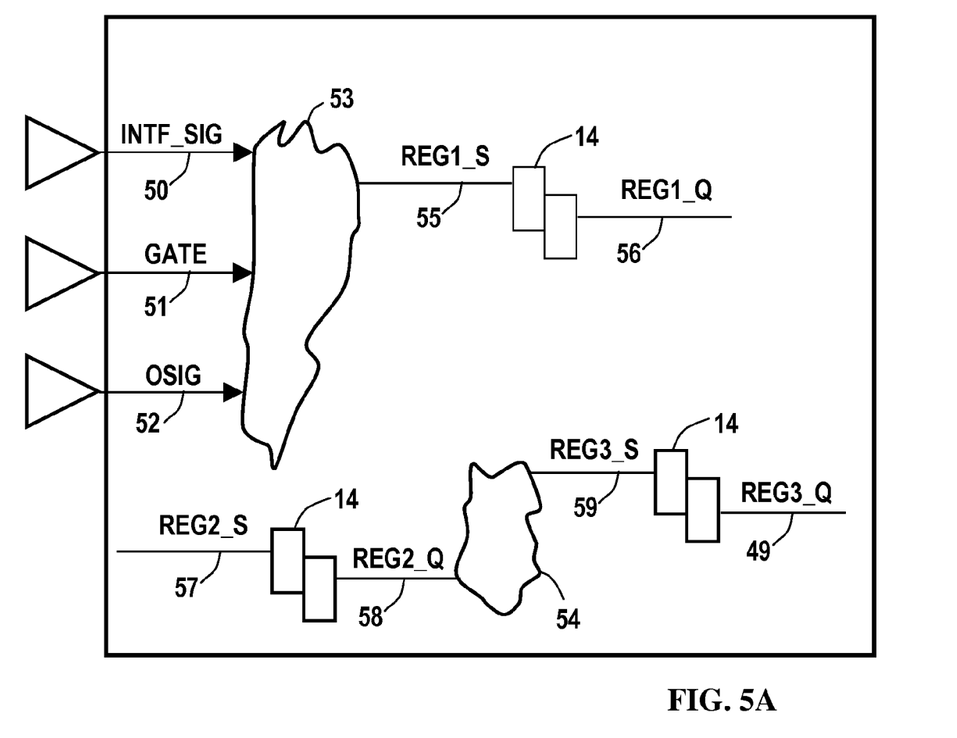
FIG. 5A shows an example design macro with arbitrary latch and interconnect topologies.
Figure 5B:
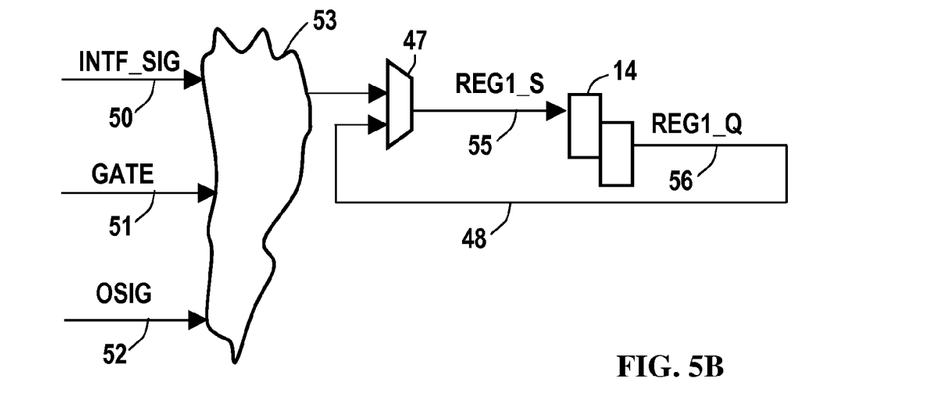
FIG. 5B shows a detailed example of a hold-type latch which may be present in the same macro of FIG. 5A.

A critical aspect of our invention is the automated testbench generation Autogen Testbench step (32) from FIG. 3. FIGS. 5A and 5B illustrate an example of how this testbench is constructed using a sample macro, entity, design structure, or element, which terms are used interchangeably herein. Although the present invention is taught with respect to verification of gating conditions at a macro, entity, design structure, component, or element level, it should be understood by one skilled in the art that the same method is applicable to any type of gating condition at any level of a hierarchical design structure such as that depicted in FIG. 2.

FIG. 5A shows a sample macro containing a plurality of typical latches (14) arranged in a network topology. For purposes of illustration, this macro comprises an interface signal known as INTF_SIG (50) which requires gating, the associated gating signal, denoted GATE (51), and some arbitrary input, OSIG (52) which could come from another macro, entity, design structure, component, element or unit within the same chip, or could even be an external interface signal. The key difference between INTF_SIG and OSIG is that OSIG is asserted to require no gating. These signals enter some arbitrary logic structure (53) which includes the necessary fence gating and may or may not include additional functionality. Eventually a path terminates in the latch (14) instantiated as REG1_Q (56). In the preferred embodiment, the REG1_S (55) facility is referred to as the setting signal, and is valid one clock period before the latch facility REG1_Q. Latch (14) will follow the value of REG1_S, and one clock period later that value will be available as REG1_Q to drive downstream logic.

In addition to the REG1_Q, the sample macro in FIG. 5A also contains two other example latches instantiated as REG2_Q (58) and REG3_Q (49). These latches also have corresponding setting signals REG2_S (57) and REG3_S (59). These latches are connected through an arbitrary topology (54) which may or may not share logic structures with arbitrary logic structure (53). The input to REG2_S may emanate from other internal logic structures (not shown) or from a macro input. The primary motivation for depicting REG2_Q and REG3_Q is to demonstrate the ability of the present invention to verify that all latches in the design under test that are asserted to remain stable can be verified using a single automated testbench. In other words, separate testbenches or even constructs within the testbench are not necessary even if the internal topology of the latches varies widely.

Turning our attention now to FIG. 5B, it depicts a more detailed diagram of one of the latches, REG1_Q (56) from FIG. 5A. Here it can be seen that the same inputs, INTF_SIG (50), GATE (51) and OSIG (52) traverse the same logic structure (53), but the output connects to one input leg of mux (47). The other input leg of mux (47) is connected in a feedback path to the output of latch (14) on line REG1_Q (56). The output of this mux is the actual setting signal, on line REG1_S (55). This muxing structure is an industry standard practice for creating a hold type latch. While FIG. 5A depicts the latches as one-cycle or one-shot latches, the present invention will work on either type. The vast majority of digital designs in use today comprise a mixture of the two types of latches.

Figure 6:
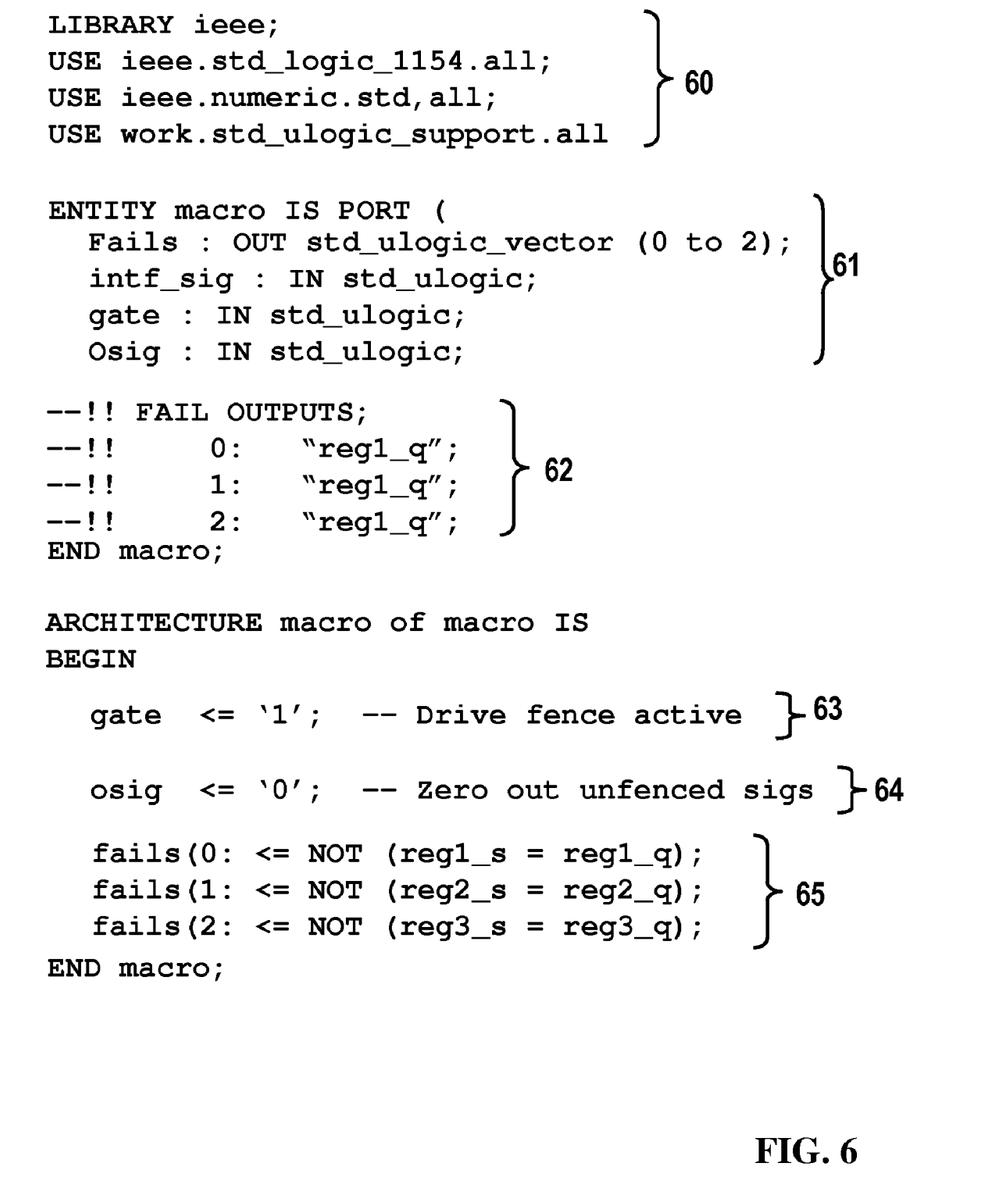
FIG. 6 is a diagram of a sample testbench that the present invention would automatically generate.

FIG. 6 depicts the associated testbench created by our invention for the sample macro shown in FIGS. 5A and 5B. The preferred embodiment employs the VHDL description language for describing testbenches, but one skilled in the art will appreciate how a multitude of description languages could be used. The header (60) in FIG. 6 is the standard boilerplate for VHDL defining all the necessary libraries and packages. One skilled in the use of the VHDL language will be familiar with the usage of such statements.

The second section is the entity declaration (61) which enumerates all the inputs and outputs of the design under test. For reasons of brevity, only the three inputs, INTF_SIG, GATE and OSIG are shown. Any other inputs or outputs for this macro would also be described in this section. There is one statement in this section that would be unfamiliar to most skilled in the art. It's the statement declaring the FAILS output. This is a special output that is used by the formal verification tool to monitor any counter examples.

Within the entity declaration area is a special section known as the fails declaration section (62). This section is used to define each unique fail event for the formal verification tool. A fail event is used to monitor rules that are asserted to be true. Should a rule be proven false, the corresponding fail event will be reported to the user through a reporting interface. The preferred embodiment employs a unique fail event for each rule (assertion) about the design to facilitate debugging. The fail events are generally numbered as bits of a multi-bit vector, and the formal verification tool for the preferred embodiment permits each bit to have an English description. In this example, said English descriptions are simply the latch names.

Below the entity declaration section is the architecture section. In a typical VHDL component, the architecture describes the behavior of the design under test. In the present invention, the architecture is used to describe three key components. The first is the gating section (63) wherein each signal in the design denoted as a gating signal from Step 1 (31) is driven to a constant "1". Below that is the non-gated input section (64) wherein all inputs to the design which have not been identified as requiring gating protection in Step 1 (31) are driven to constant zeros. The intent of the present invention is to verify that all identified latches within the design under test remain free of transitions as long as the fence is constantly driven active and the ungated signals are driven inactive. The absence of any behavioral statements pertaining to the interface signals that are asserted to require gating protection means that the formal verification tool is free to drive those signals to any value in order to explore all possible states.

The final section is the rules section (65) wherein the automated testbench generation step (32) creates the same rule for every latch asserted to remain stable. In our preferred embodiment, we assert that all latches within the macro must remain stable, however this may not be possible in all design structures. Therefore, the list of latches represented in this section must generally be identified in Step 1 (31) along with the list of interface signals being gated. Once this list is presented to the automated testbench generation step (32), it is able to create a the rule shown for each latch. Our preferred embodiment further exploits a strong nomenclature in the design which requires all latch names to end in q and all latches to have corresponding setting signals that end in s. By incorporating such practices as part of the design process, the automatic generation of the testbench is trivial. It simply takes the list of latch names substitutes q with s, and then writes out the statement consisting of the inequality function operating on the _q and _s facilities.

Although the preferred embodiment capitalizes on the aforementioned nomenclature to automatically identify the setting signal with only a list of latch names, one skilled in the art will appreciate how this step can be generalized by the explicit identification of the setting signal corresponding to each latch enumerated in the list provided by Step 31 With the myriad of design processes in existence today, there is a multitude of methods that one may employ to traverse a design structure and generate a list of latch names with their corresponding setting signals.

The list of latches and the design inputs/outputs are the primary inputs to the automated testbench generation step (31) The lists (which may be implemented as one single list or a plurality of lists) also comprises identification markers to denote which of the inputs require gating protection and the corresponding gating signal (or latch). In the general case, the list also tags all latches that are asserted to remain stable. Once this list is available the method used to create the testbench shown in FIG. 6 is very straightforward. It consists of:

enumerating every input and output into the entity declaration section (61)

creating a unique fail event for each identified latch and declaring these fail events in the fails section (62)

creating a unique assignment statement to drive each identified gating signal to a constant active state (63)

creating a unique assignment statement to drive each identified ungated input to a constant inactive state (64)

and creating a unique rule for each identified latch wherein the fail event will positively trigger if the latch facility ever deviates from its corresponding identified setting signal (65).

An essential ingredient in the present invention is the use of a formal verification tool or engine to provide a mathematical proof that any assertions made about a design under test are in fact valid for all possible state spaces. There are a myriad of formal verification tools in the industry and the present invention permits the use of any tool capable of accepting a design assertion and executing a formal reasoning method upon it. This application will not delve into the details of how these tools accomplish said proofs but one can understand more about their underlying elements through the use of, for example commonly assigned U.S. Pat. No. 6,738,955 of Andersen, Baumgartner and Roberts for "Method And System For Formal Characterization Of Average Performance" which describes generally a method of characterizing average performance in a data processing system by adding meta-tool level variables to a verification tool. These meta-tool variables keep track, at once, of all concurrent streams of execution that the tool is considering in its reachability analysis. The image of an initial state variable is found and then divided into a frontier of new states and a set of previously reached states. The previously reached states are ignored and the image of the frontier is found. This process continues until the frontier is empty and all possible states have been reached. In one embodiment of Andersen et al , the probabilities of the paths can be considered by sampling and holding input data using SMV (a model checking tool) variables.

Figure 7:
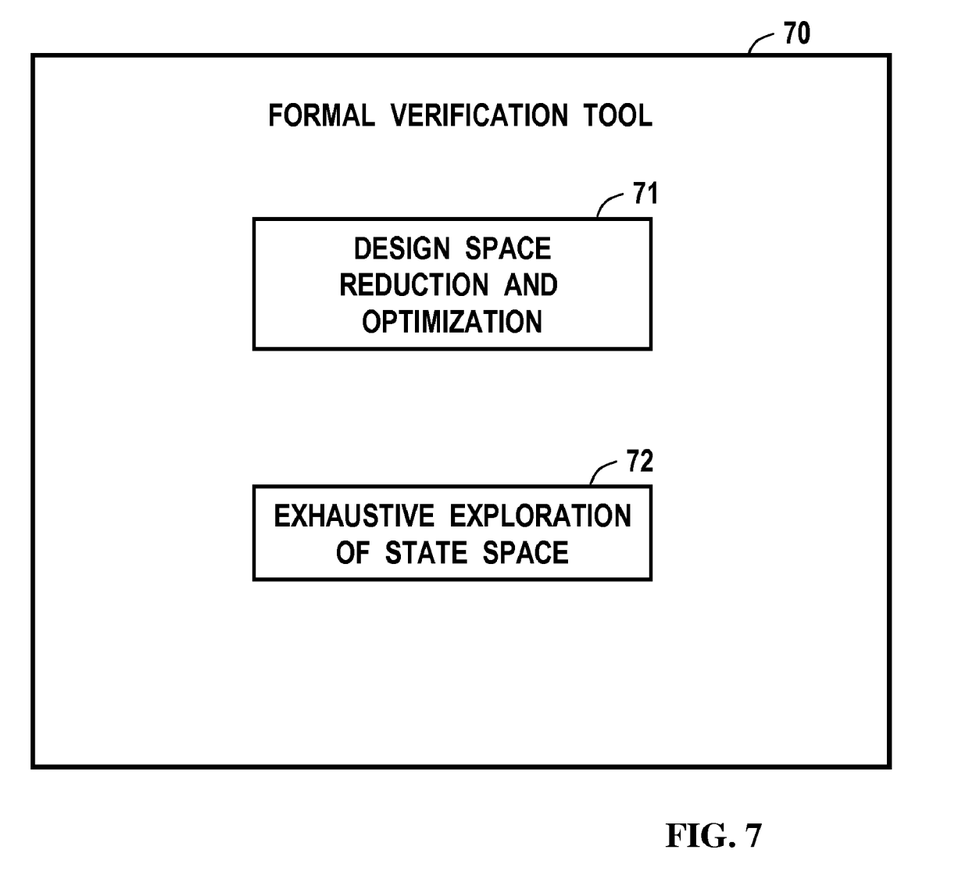
FIG. 7 depicts the main components of a formal verification process.

FIG. 7 shows a high level diagram of the two main components of any formal verification tool (70) for use in the execution step (34) of FIG. 3. The first main component provides Design Space Reduction and Optimization (71). Because so many contemporary digital designs are very complex with millions of achievable states in a typical ASIC, these formal verification engines first attack the problem by identifying the cone of influence pertinent to the rule being exercised. Referring back to the logic structure (53) in FIG. 5A, there may be many gates in that structure that exert no influence whatsoever on the REG1_Q latch (56) All of the inputs to those gates represent additional state spaces the design could achieve. However, if the logic is completely unrelated to the rule under test, then it can often be reduced or even eliminated, thereby reducing the overall state space. For example INIF—SIG may actually be a multi-bit vector with associated parity protection. Part of the logic structure (53) may include a parity check on the interface. This parity check logic would not be considered part of the cone of influence for the REG1_Q latch and therefore could be eliminated from the formal verification model. Another example of a model reduction would result from the constraints levied by the testbench. For instance, by forcing the ungated inputs to be constantly inactive, that may immediately result in logic minimizations within the model for any gates that would perform an AND function of said input.

The second main component for any formal verification tool provides for the Exhaustive Exploration of the Design State Space (72) which provides a mathematical application of all possible latch and input values in an attempt to create a state descriptor which violates one or more of the rules in the testbench. The latches and inputs are constrained as directed by the testbench, and all latches or inputs not constrained in the testbench are freely manipulated. The preferred embodiment incorporates IBM's Sixth Sense Formal Verification tool which comprises a series of different engines designed to tackle various design structures and types of rules. The explanation of these engines are beyond the scope of this application, but one skilled in the art will appreciate how the choice of formal verification engine will largely determine the scope of design that can benefit from the present invention. Regardless of the available formal verification engine, and its underlying algorithms for achieving deterministic proofs, the present invention purports the use of a formal verification tool over a typical simulation engine for the obvious reason that a typical simulation tool would require an inordinate amount of testbench tuning to achieve full coverage on a fairly large design structure. Hence the plausibility of using of a typical simulation engine is inversely proportional to the size and complexity of the design, whereas the use of a formal verification tool enables the method of the present invention to scale up to whatever size design can be accommodated by the tool itself.

The invention may be implemented, for example, by having the system for auto-generating testbench hardware design language from the design source hardware design language, and building a formal verification model from the testbench hardware design language to provide proofs and counterexamples for the auto-generated testbench rules by executing the method as a software application, in a dedicated processor or set of processors, or in a dedicated processor or dedicated processors with dedicated code. The code executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for by having the system for auto-generating testbench hardware design language from the design source hardware design language, and building a formal verification model from the testbench hardware design language to provide proofs and counterexamples for the auto-generated testbench rules by executing the method as a software application.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++", Java, Pascal, ADA, assembler, and the like.

Additionally, the program code may, for example, be compressed, encrypted, or both, and may include executable code, script code and wizards for installation, as in Zip code and cab code. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

We claim:

1. A method of verifying gating rules comprising the steps of generating a testbench hardware design language code from a design source hardware design language code, and building a formal verification model comprising the testbench hardware design language code and a hardware design language for a design under test to provide to a design verification tool, by the steps as follows:

(I) generating the testbench hardware design language code from the design source hardware design language code by the steps as follows:
  a. identifying interface signals requiring gating verification, including denoting registers and/or latches that are asserted to remain stable from a design source;
  b. identifying each component to be independently verified using the design source and an assertion that registers and latches within a component will remain stable during gating;
  c. extracting a list of interfaces, registers, and latches from each component;
  d. generating a testbench, said testbench driving a formal verification step utilizing the list of interfaces, registers, and latches from each component as an input to produce the testbench, the testbench having automated rules to verify assertions regarding latch stability;
  e. compiling the testbench to form a verification model; and (II) building a formal verification model comprising the testbench hardware design language code and the hardware design language for the design under test for provision thereof to a design verification tool, by the steps as follows:
  f. executing a formal verification process to determine that all latches and registers asserted to remain stable under a gating condition are stable, including attempting to produce a counter example, illustrating how a particular latch can change state while its associated fence signal is being applied; and
  g. if counter examples exist, repetitively updating the design source to fix an error until the design source completes the formal verification process without any counter examples, else characterizing that the verification process is complete and all identified interfaces are concluded to be properly gated.

2. The method of claim 1, said step I further comprising identifying each component to be independently verified using the design source and an overall assertion that all registers and latches within a component will remain stable during gating.

3. The method of claim 1, said step I further comprising extracting the list of interfaces, registers and latches from each component by exploiting a register keyword in a signal declaration portion of a VHDL source.

4. The method of claim 1 comprising generating the testbench by a method comprising the steps as follows:
  a. enumerating inputs and outputs into an entity declaration section;
  b. creating a unique fail event for each identified latch and declaring fail events in a fail section;
  c. creating an assignment statement to drive each identified gating signal to a constant active state;
  d. creating an assignment statement to drive each identified ungated input to a constant inactive state; and e. creating a rule for each identified latch wherein the fail event will positively trigger if a latch facility deviates from a corresponding identified setting signal.

5. The method of claim 1 wherein gating is chosen from the group consisting of fencing, clock gating, and power gating.

6. The method of claim 1 further comprising tracking a bill of materials for a model as the model is validated.

7. A system for testing a multi-domain microelectronic circuit, said circuit having built in self testing circuitry, said system being adapted to generate a testbench hardware design language code from a design source hardware design language code, and to build a formal verification model comprising the testbench hardware design language code and a hardware design language for a design under test to provide to a design verification tool by a method comprising the steps as follows:

(I) generating testbench hardware design language code from the design source hardware design language code by the steps as follows:
  a. identifying interface signals requiring gating verification, including denoting registers and/or latches that are asserted to remain stable from a design source;
  b. identifying each component to be independently verified using the design source and an overall assertion that all registers and latches within a component will remain stable during gating,
  c. extracting a list of interfaces, registers and latches from each component;
  d. generating a testbench, said testbench driving a formal verification step utilizing the list of interfaces, registers and latches from each component as an input to produce the testbench, said testbench having automated rules to verify assertions regarding latch stability;
  e. compiling the testbench to form a verification model; and (II) building a formal verification model comprising the testbench hardware design language code and the hardware design language for the design under test for provision thereof to a design verification tool by the steps as follows:
  f. executing a formal verification process to determine that all latches and registers asserted to remain stable under a gating condition are stable, including attempting to produce a counter example illustrating how a particular latch can change state while its associated fence signal is being applied; and
  g. if counter examples exist, repetitively updating the design source to fix an error until the design source completes the formal verification process without any counterexamples, else characterizing that the verification is complete and all identified interfaces are concluded to be properly gated.

8. The system of claim 7 further adapted to identify each component to be independently verified using the design source and an overall assertion that all registers and latches within a component will remain stable during gating.

9. The system of claim 7 further adapted to extract the list of interfaces, registers and latches from each component by exploiting the register keyword in a signal declaration portion of the VHDL source.

10. The system of claim 7 further adapted to generate the testbench by a method comprising the steps as follows:
  a. enumerating inputs and outputs into an entity declaration section;
  b. creating a unique fail event for each identified latch and declaring fail events in a fails section;
  c. creating an assignment statement to drive each identified gating signal to a constant active state;
  d. creating an assignment statement to drive each identified ungated input to a constant inactive state; and
  e. creating a rule for each identified latch wherein the fail event will positively trigger if the latch facility deviates from its corresponding identified setting signal.

11. The system of claim 7 wherein gating is chosen from the group consisting of fencing, clock gating, and power gating.

12. The system of claim 7 further adapted to track a bill of materials for a model as the model is validated.

13. A program product comprising:
  a computer program storage device for storing a computer program which when executed by a processor causes the processor to configure and control a system for testing a multi-domain microelectronic circuit with said circuit having built-in self testing circuitry,
  said system being adapted to generate a testbench hardware design language code from a design source hardware design language code, and to build a formal verification model comprising the testbench hardware design language code and the hardware design language for a design under test for provision thereof to provide to a design verification tool by the method of as follows:

(I) generating testbench hardware design language code from a design source hardware design language code by:
  a. identifying interface signals requiring gating verification, including denoting registers and/or latches that are asserted to remain stable from a design source;
  b. identifying each component to be independently verified using the design source and an overall assertion that all registers and latches within a component will remain stable during gating;
  c. extracting a list of interfaces, registers, and latches from each component;
  d. generating a testbench, said testbench driving a formal verification step utilizing the list of interfaces, registers, and latches from each component as an input to produce the testbench, the testbench having automated rules to verify assertions regarding latch stability; and
  e. compiling the testbench to form a verification model; and (II) building a formal verification model comprising the testbench hardware design language code and the hardware design language for the design under test for provision thereof to a design verification tool by the steps as follows:
  f. executing a formal verification process to determine that all latches and registers asserted to remain stable under a gating condition are stable, including attempting to produce a counter example illustrating how a particular latch can change state while its associated fence signal is being applied; and
  g. if counter examples exist, repetitively updating the design source to fix an error until the design source completes the formal verification process without any counter examples, else characterizing that the verification process is complete and all identified interfaces are concluded to be properly gated.

14. The program product of claim 13 further adapted to extract the list of interfaces, registers and latches from each component by exploiting a register keyword in a signal declaration portion of a VHDL source.

15. The program product of claim 13 further adapted to generate the testbench by a method comprising the steps of as follows:
- a. enumerating inputs and outputs into an entity declaration section,
- b. creating a unique fail event for each identified latch and declaring these fail events in a fails section;
- c. creating an assignment statement to drive each identified gating signal to a constant active state;
- d. creating an assignment statement to drive each identified ungated input to a constant inactive state; and
- e. creating a rule for each identified latch wherein the fail event will positively trigger if a latch facility deviates from its corresponding identified setting signal.

16. The program product of claim 13 wherein gating is chosen from the group consisting of fencing, clock gating, and power gating.

17. The program product of claim 13 further adapted to track a bill of materials for a model as the model is validated.

* * * * *